(12) United States Patent  
Park et al.

(10) Patent No.: US 8,174,328 B2
(45) Date of Patent: May 8, 2012

(54) DUAL-BAND WIDEBAND LOCAL OSCILLATION SIGNAL GENERATOR

(75) Inventors: Bong-Hyuk Park, Daejeon (KR); Kwang-Chun Lee, Daejeon (KR); Hyun-Kyu Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 83 days.

(21) Appl. No.: 12/860,530

(22) Filed: Aug. 20, 2010

(65) Prior Publication Data

US 2011/0140746 A1    Jun. 16, 2011

(30) Foreign Application Priority Data

Dec. 15, 2009   (KR) .................. 10-2009-0124607

(51) Int. Cl.
*H03B 21/01*   (2006.01)
*H03B 21/02*   (2006.01)
*H03B 21/04*   (2006.01)
*H03B 27/00*   (2006.01)
*H04B 1/26*    (2006.01)
*H04B 1/28*    (2006.01)

(52) U.S. Cl. ............ 331/37; 331/38; 331/40; 331/41; 331/45; 331/179; 455/323; 455/333

(58) Field of Classification Search ............ 331/16–18, 331/25, 37–43, 45, 179; 455/313, 323, 333
See application file for complete search history.

(56) References Cited

U.S. PATENT DOCUMENTS

| 2004/0106390 | A1  | 6/2004 | Oh et al. |
| 2007/0105518 | A1* | 5/2007 | Chang et al. .............. 455/260 |
| 2008/0079500 | A1  | 4/2008 | Rofougaran |

FOREIGN PATENT DOCUMENTS

KR   2007-0077664 A   7/2007

* cited by examiner

Primary Examiner — David Mis
(74) Attorney, Agent, or Firm — Rabin & Berdo, P.C.

(57) ABSTRACT

A dual-band wideband local oscillation signal generator includes an oscillation unit, a division unit, a poly phase filter (PPF), a switch unit, and a single side band (SSB) mixer. The oscillation unit is configured to generate a positive in-phase (IP) signal, a negative in-phase (IN) signal, a negative quadrature-phase (QN) signal, and a positive quadrature-phase (QP) signal. The division unit is configured to divide frequencies of the IP signal and the IN signal and generate an RF signal. The PPF is configured to receive the IP signal and the IN signals inputted to the division unit, and generate an LO IP signal, an LO IN signal, an LO QP signal, and an LO QN signal. The switch unit is configured to receive the generated LO signals and select a high band frequency signal or a low band frequency signal.

7 Claims, 4 Drawing Sheets

US 8,174,328 B2

DUAL-BAND WIDEBAND LOCAL OSCILLATION SIGNAL GENERATOR

CROSS-REFERENCE(S) TO RELATED APPLICATIONS

The present application claims priority of Korean Patent Application No. 10-2009-0124607, filed on Dec. 15, 2009, which is incorporated herein by reference in its entirety.

BACKGROUND OF THE INVENTION

1. Field of the Invention

Exemplary embodiments of the present invention relate to a wideband local oscillation signal generator; and, more particularly, to a dual-band wideband local oscillation signal generator which is applicable to a dual-mode system.

2. Description of Related Art

The fourth generation (4G) mobile communication is a next generation of wireless communication technology which can reach a date rate of 1 Gbps in a stationary state and a data rate of 100 Mbps in a moving state. The 4G mobile communication reaches 50 times the data rate of the third generation (3G) mobile communication (WCDMA) in a high-speed moving state and 10 times the data rate of the ultra-high-speed Internet in a stationary state. The 1-Gbps data rate means that 100 MP3 music files (300 MByte) can be downloaded in 2.4 seconds, 1 movie corresponding to 1 piece of CD (800 Mbyte) can be downloaded in 5.6 seconds, and 20-M HDTV broadcasting can be downloaded in 12.5 seconds.

In addition, the 4G mobile communication organically can interlink different networks, such as cable/wireless telephone networks, satellite communication networks, wireless LAN networks, and digital broadcasting networks, and allow voice communications, high-quality TV viewing, and Internet connection at the same time through a single mobile phone, without regard to position of users.

The International Telecommunication Union (ITU), International Standardization Organization, calls the 4G mobile communication "SBI2K" (Systems Beyond IMT 200). WiMAX and Long Term Evolution (LTE) technology are powerful candidates of the 4G mobile communication systems.

In the 4G mobile communication systems such as WiMAX and LTE, a wide frequency band is required for high-speed wireless communications as the quantity of data to be transmitted increases.

SUMMARY OF THE INVENTION

An embodiment of the present invention is directed to a dual-band wideband local oscillation signal generator which is applicable to LTE and WiMAX dual-mode systems for 4G communications.

Another embodiment of the present invention is directed to a wideband signal generation apparatus which has a 1.5-GHz bandwidth while reducing an operating frequency range of a voltage controlled oscillator (VCO).

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a dual-band wideband local oscillation signal generator includes: an oscillation unit configured to generate a positive in-phase (IP) signal, a negative in-phase (IN) signal, a negative quadrature-phase (QN) signal, and a positive quadrature-phase (QP) signal; a division unit configured to divide frequencies of the IP signal and the IN signal and generate an RF signal; a poly phase filter configured to receive the IP signal and the IN signals inputted to the division unit, and generate an LO IP signal, an LO IN signal, an LO QP signal, and an LO QN signal; a switch unit configured to receive the generated LO signals and select a high band frequency signal or a low band frequency signal; and a single side band (SSB) mixer configured to generate a local oscillation signal by using sum and difference signals of the divided signal and the signal selected by the switch unit.

DESCRIPTION OF SPECIFIC EMBODIMENTS

Figure 1:
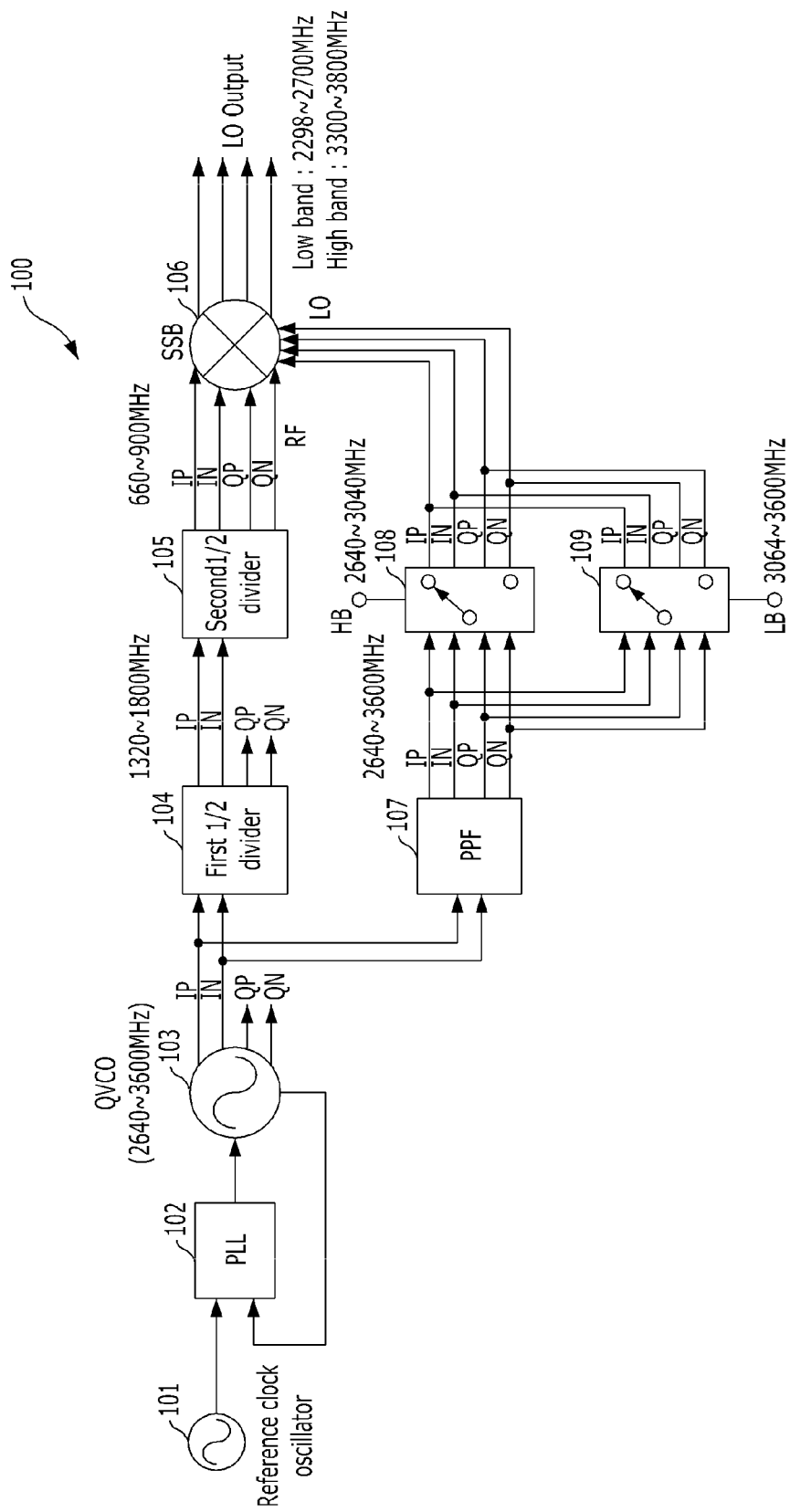
FIG. 1 is a block diagram illustrating the architecture of a dual-band wideband local oscillation signal generator in accordance with an embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating the architecture of a dual-band wideband local oscillation signal generator in accordance with an embodiment of the present invention.

Referring to FIG. 1, the wideband local oscillation signal generator 100 includes an oscillation unit, a division unit, a switch unit, and a single side band (SSB) mixer 106. Specifically, the oscillation unit includes a reference clock oscillator 101, a phase locked loop (PLL) 102, and a quadrature voltage controlled oscillator (QVCO) 103. The division unit includes a first ½ divider 104 and a second ½ divider 105. The switch unit includes a poly phase filter (PPF) 107, a first switch 108, and a second switch 109.

A signal supplied from the reference clock oscillator 101 passes through the PLL 102 and the QVCO 103 generates locked in-phase (I) and quadrature-phase (Q) differential signals. That is, the QVCO 103 generates a positive in-phase signal IP, a negative in-phase signal IN, a positive quadrature-phase signal QP, and a negative quadrature-phase signal QN which have the frequencies of 2,640 MHz to 3,600 MHz.

The PLL 102 locks the phases of the positive in-phase signal IP, the negative in-phase signal IN, the positive quadrature-phase signal QP, and the negative quadrature-phase signal QN which are generated by the QVCO 103 in the frequency range of 2,640 MHz to 3,600 MHz.

The first ½ divider 104 receives the positive in-phase signal IP and the negative in-phase signal IN generated by the QVCO 103 and divides the frequencies of the positive in-phase signal IP and the negative in-phase signal IN by two. The first ½ divider 104 divides the frequencies (2,640 MHz to 3,600 MHz) of the positive in-phase signal IP and the negative in-phase signal IN by two, and converts the signals IP and IN into signals having the frequencies of 1,320 MHz to 1,800 MHz.

The second ½ divider 105 divides the frequencies of the output signals of the first ½ divider 104 by two. The second ½ divider 105 receives the positive in-phase signal IP and the negative in-phase signal IN having the frequencies of 1,320 MHz to 1,800 MHz, which are outputted from the first ½ divider 104, and divides the frequencies of the output signals IP and IN of the first ½ divider 104 by two to thereby generate four signals, that is, a positive in-phase signal IP, a negative in-phase signal IN, a positive quadrature-phase signal QP, and a negative quadrature-phase signal QN having the frequencies of 660 MHz to 900 MHz. The four signals generated by the second ½ divider 105 will be referred to as RF signals. The second ½ divider 105 transfers the positive in-phase signal IP, the negative in-phase signal IN, the positive quadrature-phase signal QP, and the negative quadrature-phase signal QN to the SSB mixer 106.

In addition, the positive in-phase signal IN and the negative in-phase signal IN among the output signals of the QVCO 103 are also inputted to the PPF 107.

The PPF 107 generates a positive in-phase signal IP, a negative in-phase signal IN, a positive quadrature-phase signal QP, and a negative quadrature-phase signal QN having the frequencies of 2,640 MHz to 3,600 MHz by using the positive in-phase signal IP and the negative in-phase signal IN inputted from the QVCO 103, and transfers the generated signals to the switches 108 and 109 which select bands. The four signals generated by the PPF 107 will be referred to as local oscillation (LO) signals.

The switch 108 for high band selection selects the LO signals of 2,640 MHz to 3,040 MHz by a control signal HB of the QVCO 103 and transfers the selected LO signals to the SSB 106, and the switch 109 for low band selection selects the LO signals of 3,064 MHz to 3,600 MHz by a control signal LB of the QVCO 103 and transfers the selected LO signals to the SSB 106.

When the low band frequency signal is selected by the switch 109, the positive quadrature-phase signal QP and the negative quadrature-phase signal QN generated by the PPF 107 are phase-shifted according to the circuit connection diagram and converted into the negative quadrature-phase signal QN and the positive quadrature-phase signal QP, respectively. Therefore, the 180-degree phase shift occurs so that the low band frequency signals in the SSB mixer 106 generate a difference signal of the LO signals of 3,064 MHz to 3,600 MHz and the RF signals of 766 MHz to 900 MHz and signals of 2,298 MHz to 2,700 MHz are outputted.

The high band frequency signals generate a sum signal of the LO signals of 2,640 MHz to 3,040 MHz and the RF signals of 766 MHz to 900 MHz, and signals of 3,300 MHz to 3,800 MHz are outputted.

As described above, the lowest frequency (2,298 MHz) of the low band frequency signal and the highest frequency (3,800 MHz) of the high band frequency signal, which are outputted from the SSB mixer 106, have a bandwidth difference of 1.5 GHz.

Both of the QVCO 103 and the PPF 107 are designed to generate the I and Q signals, and one of them may be used according to the designer's design convenience. That is, when the QVCO 103 is used, the PPF 107 is omitted. When the PPF 107 is used, the QVCO 103 may be designed with a VCO which simply generates a differential signal.

Figure 2:
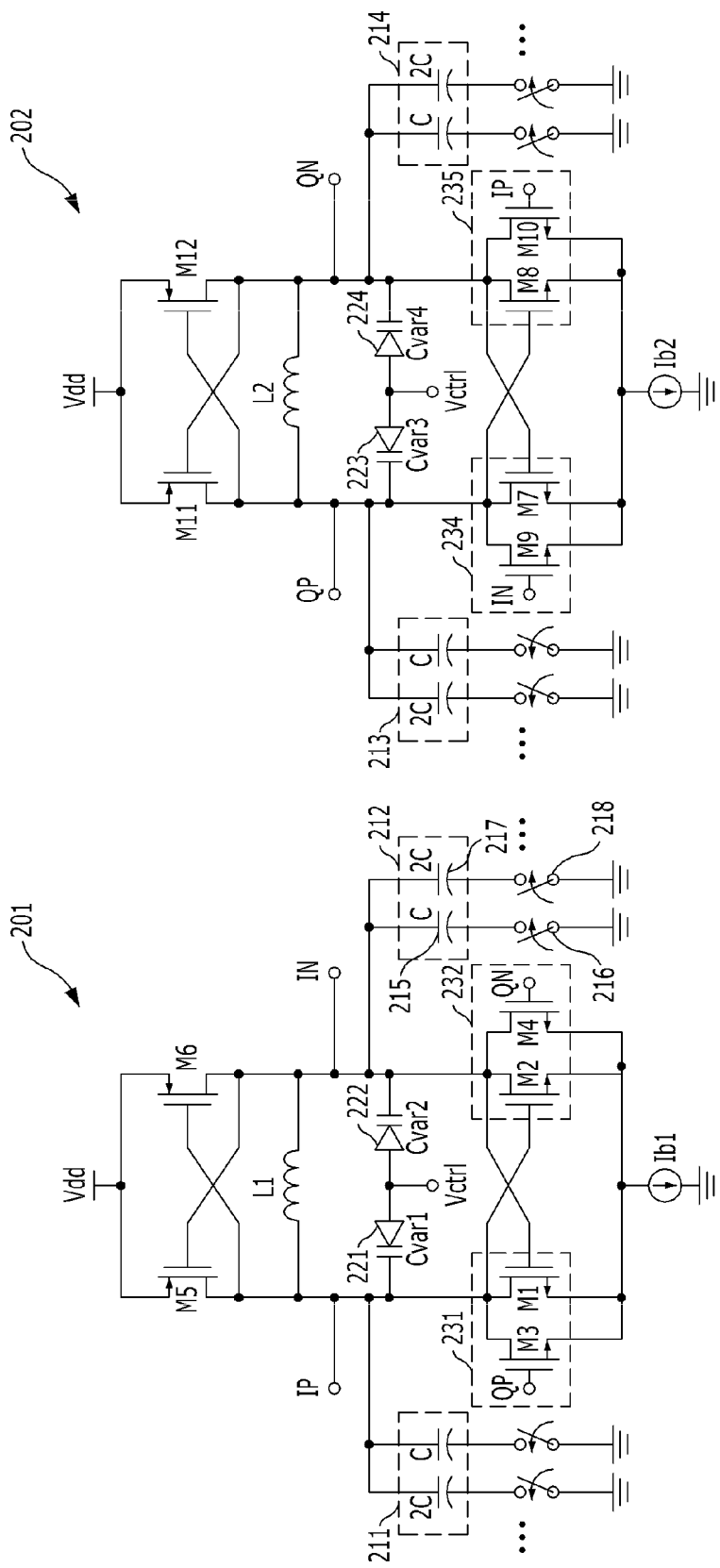
FIG. 2 is a circuit diagram of a quadrature voltage controlled oscillator (QVCO) in accordance with an embodiment of the present invention.

FIG. 2 is a circuit diagram of the QVCO in accordance with an embodiment of the present invention.

Referring to FIG. 2, the oscillation unit is implemented using a differential oscillator with field effect transistors (FETs) which are active elements. Specifically, a VCO 201 includes a plurality of capacitor banks 211 and 212 for wide-interval frequency tuning, varactors 221 and 222 for fine frequency tuning, and a plurality of coupling FETs 231 and 232. A VCO 202 includes a plurality of capacitor banks 213 and 214 for wide-interval frequency tuning, varactors 223 and 224 for fine frequency tuning, and a plurality of coupling FETs 234 and 235.

The plurality of capacitor banks 211, 212, 213 and 214 are used for frequency tuning. The capacitor bank 212 will be representatively described. The capacitor bank 212 has a structure in which a capacitor 215 and a switch 216 are connected in series. If necessary, such a structure in which the capacitor and the switch are connected in series may be provided in plurality.

When the switch 216 of the capacitor bank 212 is turned on, the capacitor 215 is connected to the ground and thus the VCO 201 can generate a frequency. Also, when the switch 218 connected in parallel is turned on, the capacitance of the capacitor is increased and thus the frequency is reduced.

The VCOs 201 and 202 are symmetrical in parallel. The outputs and inputs of the VCOs 210 and 202 are connected in a feedback loop structure, thereby forming a QVCO.

One VCO 201 of the two VCOs 201 and 202 may output the positive in-phase signal IP and the negative in-phase signal IN, and the other VCO 202 may output the positive quadrature-phase signal QP and the negative quadrature-phase signal QN.

Figure 3:
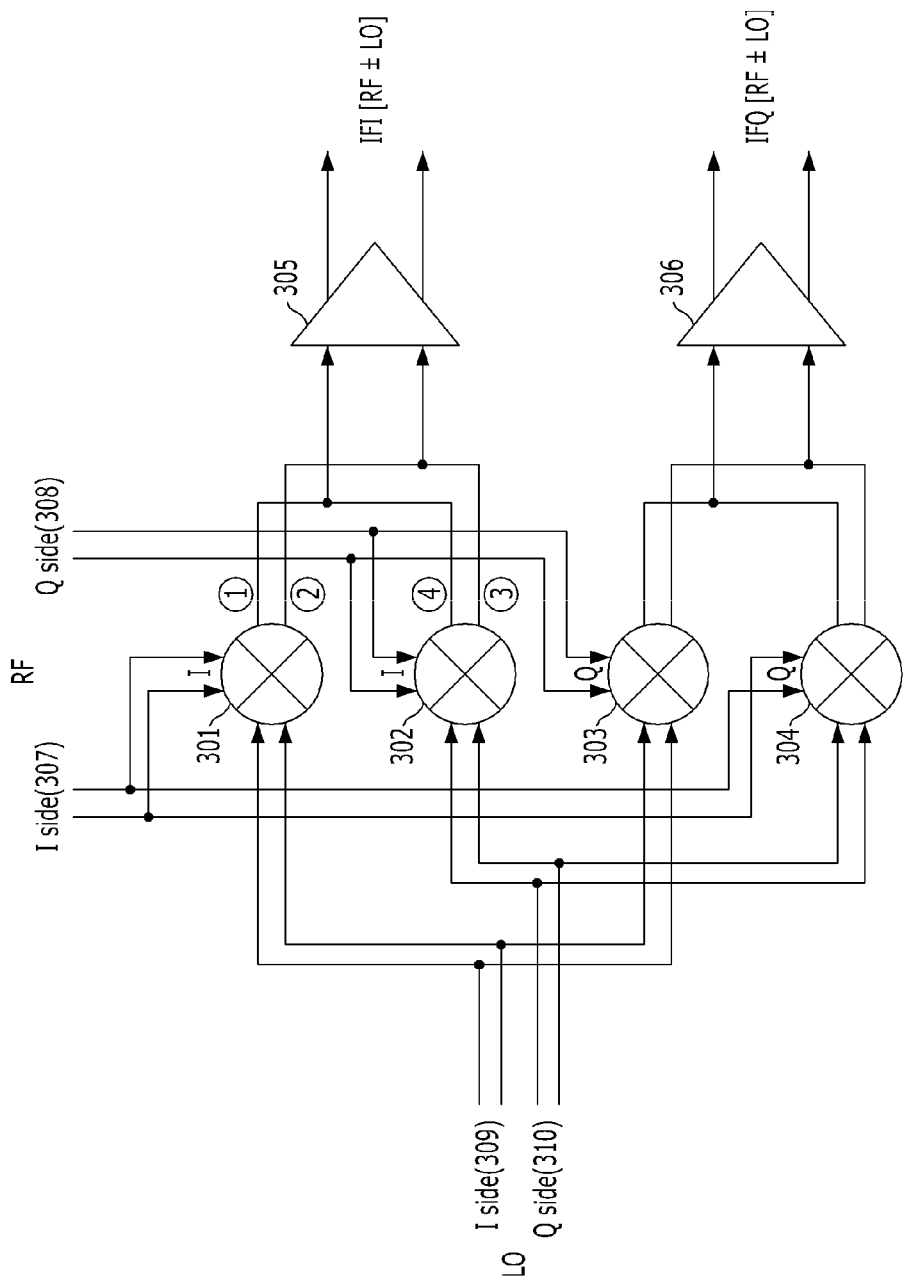
FIG. 3 is a configuration diagram of a single side band (SSB) mixer in accordance with an embodiment of the present invention.

FIG. 3 is a configuration diagram of the SSB mixer in accordance with an embodiment of the present invention.

The SSB mixer 106 in accordance with the embodiment of the present invention may include four Gilbert cell mixers 301, 302, 303 and 304 configured to mix the RF signals and the LO signals, and two buffers 305 and 306 configured to reduce the attenuation of the signals.

The operation of the SSB 106 will be described below with reference to FIG. 3. For convenience of explanation, only the output of the I mixer will be described.

If signals inputted to the RF I side 307 are expressed using equations, the RF IP signal may be expressed as $\cos \omega_1 t$ and the RF IN signal may be expressed as $-\cos \omega_1 t$. If signals inputted to the RF Q side 308 are expressed using equations, the RF QP signal may be expressed as $\sin \omega_1 t$ and the RF QN signal may be expressed as $-\sin \omega_1 t$.

In addition, if signals inputted to the LO I side 309 are expressed using equations, the LO IP signal may be expressed as $\cos \omega_2 t$ and the LO IN signal may be expressed as $-\cos \omega_2 t$. If signals inputted to the LO Q side 310 are expressed using equations, the LO QP signal may be expressed as $\sin \omega_2 t$ and the LO QN signal may be expressed as $-\sin \omega_2 t$.

When the RF I side signal 307, the RF Q side signal 308, the LO I side signal 309, and the LO Q side signal 310 are inputted as described above, the four mixers 301, 302, 303 and 304 mix the respective signals according to the connection structure of FIG. 3, and the buffers 305 and 306 receive the mixed signals to generate local signals by using the sum and difference of the RF signals and the LO signals.

Using the RF signals and the LO signals, the output signals of nodes ①, ②, ③ and ④ of the I mixers 305 and 306 illustrated in FIG. 3 are expressed as Equations 1 to 4 below.

$$\cos \omega_1 t \cos \omega_2 t + \cos \omega_1 t \cos \omega_2 t = 2 \cos \omega_1 t \cos \omega_2 t = \cos(\omega_1 + \omega_2)t + \cos(\omega_1 - \omega_2)t \quad \text{Eq. 1}$$

$$-\cos \omega_1 t \cos \omega_2 t - \cos \omega_1 t \cos \omega_2 t = -2 \cos \omega_1 t \cos \omega_2 t = -\cos(\omega_1 + \omega_2)t - \cos(\omega_1 - \omega_2)t \quad \text{Eq. 2}$$

$$\sin \omega_1 t \sin \omega_2 t + \sin \omega_1 t \sin \omega_2 t = 2 \sin \omega_1 t \sin \omega_2 t = -\cos(\omega_1 + \omega_2)t + \cos(\omega_1 - \omega_2)t \quad \text{Eq. 3}$$

$$-\sin \omega_1 t \sin \omega_2 t - \sin \omega_1 t \sin \omega_2 t = -2 \sin \omega_1 t \sin \omega_2 t = \cos(\omega_1 + \omega_2)t - \cos(\omega_1 - \omega_2)t \quad \text{Eq. 4}$$

Equations 1 to 4 above refer to the output signals of the nodes ①, ②, ③ and ④ of FIG. 3, respectively.

The buffer 305 related to the I mixers 301 and 302 mixes the output signals of the nodes ① and ④ and generates the positive in-phase signal IP which is expressed as Equation 5 below.

$$2 \cos(\omega_1 + \omega_2)t \quad \text{Eq. 5}$$

Also, the buffer 305 related to the I mixers 301 and 302 mixes the output signals of the nodes ② and ③ and generates the negative in-phase signal IN which is expressed as Equation 6 below.

$$-2 \cos(\omega_1 + \omega_2)t \quad \text{Eq. 6}$$

As expressed in Equations 5 and 6, the final output signal IFI is differentially represented by the sum signal of the RF signal and the LO signal.

If the phase of the signal inputted to the LO Q side 310 is inverted by the switch 109, Equations 3 and 4 may be expressed as Equations 7 and 8 below.

In addition, Equation 7 expresses the output signal of the node ③, and Equation 8 expresses the output signal of the node ④.

$$-\sin \omega_1 t \sin \omega_2 t - \sin \omega_1 t \sin \omega_2 t = -2 \sin \omega_1 t \sin \omega_2 t = \cos(\omega_1 + \omega_2)t - \cos(\omega_1 - \omega_2)t \quad \text{Eq. 7}$$

$$\sin \omega_1 t \sin \omega_2 t + \sin \omega_1 t \sin \omega_2 t = 2 \sin \omega_1 t \sin \omega_2 t = -\cos(\omega_1 + \omega_2)t + \cos(\omega_1 - \omega_2)t \quad \text{Eq. 8}$$

The buffer 305 related to the I mixers 301 and 302 mixes the output signal of the node ① and the phase-inverted signal of the node ④ and generates the positive in-phase signal IP which is expressed as Equation 9 below.

$$2 \cos(\omega_1 - \omega_2)t \quad \text{Eq. 9}$$

The buffer 305 related to the I mixers 301 and 302 mixes the output signal of the node ② and the phase-inverted signal of the node ③ and generates the negative in-phase signal IN which is expressed as Equation 10 below.

$$-2 \cos(\omega_1 - \omega_2)t \quad \text{Eq. 10}$$

As expressed in Equations 9 and 10, when the phase inversion occurs, the final output signal IFI is differentially represented by the difference signal of the RF signal and the LO signal.

Figure 4:
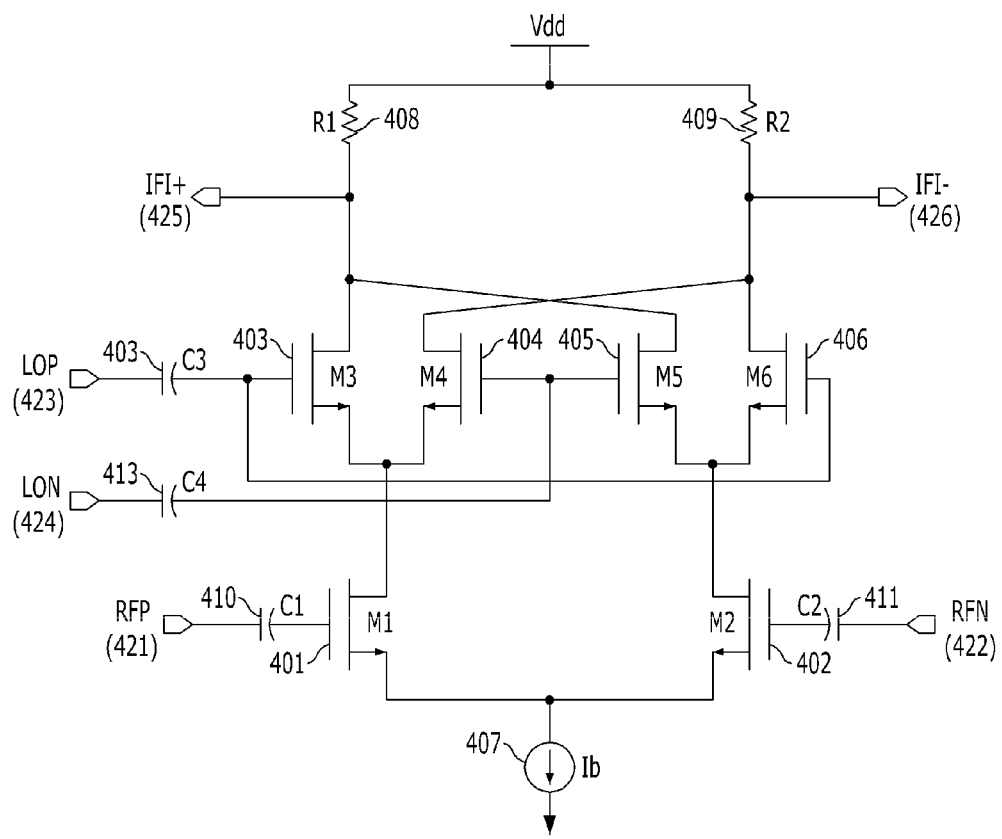
FIG. 4 is a circuit diagram of mixers in accordance with an embodiment of the present invention.

FIG. 4 is a circuit diagram of mixers in accordance with an embodiment of the present invention.

FIG. 4 is a detailed circuit diagram of the mixers 301, 302, 303 and 304 illustrated in FIG. 3. The mixers 301, 302, 303 and 304 may include six NMOS transistors 401, 402, 403, 404, 405 and 406, load resistors 408 and 409, and a current source 407.

The input signals are an RFP signal 421, an RFN signal 422, an LOP signal 423, and an LON signal 424, and the output signals are an IFI+ signal 425 and an IFI− signal 426.

The RFP signal 421 refers to the RF IP signal and the RF QP signal among the ¼ divided RF signals having passed through the first ½ divider 104 and the second ½ divider 105. Also, the RFN signal 422 refers to the RF IN signal and the RF QN signal among the ¼ divided RF signals having passed through the first ½ divider 104 and the second ½ divider 105.

The LOP signal 423 refers to the LO IP signal and the LO QP signal among the LO signals obtained when the signal generated from the PPF 107 has passed through the switches 108 and 109. Also, the LON signal 424 refers to the LO IN signal and the LO QN signal obtained when the signal generated from the PPF 107 has passed through the switches 108 and 109.

The output signals IFI+ signal 425 and the IFI− signal 426 are generated as the local oscillation signals by making the sum or difference signal of the RFP signal 421, the RFN signal 422, the LOP signal 423, and the LON signal 424 according to the circuit connection of FIG. 4.

As described above, the dual-band wideband local oscillation signal generator in accordance with the embodiment of the present invention is applied to the LTE/WiMAX dual-mode system for 4G communications. The wideband signal having the bandwidth of 1.5 GHz can be generated while reducing the operating frequency range of the VCO.

Furthermore, since the signal generated from the VCO is different from the local oscillation signal supplied to the transmission/reception stages, it is possible to reduce the VCO pulling that the VCO frequency is pulled toward the frequency of the transmitter output signal.

Moreover, the switch units which select the high band frequency signal and the low band frequency signal are provided to thereby achieve the band selection.

While the present invention has been described with respect to the specific embodiments, it will be apparent to those skilled in the art that various changes and modifications may be made without departing from the spirit and scope of the invention as defined in the following claims.

What is claimed is:

1. A dual-band wideband local oscillation signal generator, comprising:
    an oscillation unit configured to generate a positive in-phase (IP) signal, a negative in-phase (IN) signal, a negative quadrature-phase (QN) signal, and a positive quadrature-phase (QP) signal;
    a division unit configured to divide frequencies of the IP signal and the IN signal and generate an RF signal;
    a poly phase filter configured to receive the IP signal and the IN signals inputted to the division unit, and generate an LO IP signal, an LO IN signal, an LO QP signal, and an LO QN signal;
    a switch unit configured to receive the generated LO signals and select a high band frequency signal or a low band frequency signal; and
    a single side band (SSB) mixer configured to generate a local oscillation signal by using sum and difference signals of the divided signal and the signal selected by the switch unit.

2. The dual-band wideband local oscillation signal generator of claim 1, wherein the oscillation unit comprises:
    a reference clock oscillator configured to generate a reference clock;
    a quadrature voltage controlled oscillator (QVCO) configured to the IP signal, the IN signal, the QN signal, and the QP signal; and
    a phase locked loop (PLL) configured to lock phases of the generated IP, IN, QP and QN signals.

3. The dual-band wideband local oscillation signal generator of claim 1, wherein the division unit comprises:
 a first ½ divider configured to divide frequencies of the IP and IN signals generated from the oscillation unit by two; and
 a second ½ divider configured to divide the ½ divided IP and IN signals by two, and an RF IP signal, an RF IN signal, an RF QP signal, and an RF QN signal.

4. The dual-band wideband local oscillation signal generator of claim 1, wherein the switch unit comprises:
 a first switch configured to receive the generated LO signals and select a high band frequency signal by a control signal of the QVCO; and
 a second switch configured to receive the generated LO signals and select a local band frequency signal by a control signal of the QVCO.

5. The dual-band wideband local oscillation signal generator of claim 4, wherein the second switch is configured to invert phases of the LO QP signal and the LO QN signal by 180 degrees, and transfer the phase-inverted signals to the SSB mixer.

6. The dual-band wideband local oscillation signal generator of claim 1, wherein the QVCO comprises:
 two symmetrical cross-coupled VCOs coupled in parallel; and
 a capacitor bank for frequency tuning; and
 a varactor for fine frequency tuning.

7. The dual-band wideband local oscillation signal generator of claim 1, wherein the SSB mixer comprises:
 four Gilbert cell mixers configured to mix the RF signals and the LO signals; and
 two buffers configured to reduce signal attenuation.

* * * * *